(12) United States Patent
Kanemaru

(10) Patent No.: US 9,484,509 B2
(45) Date of Patent: Nov. 1, 2016

(54) LIGHTING DEVICE AND METHOD OF MANUFACTURING THE SAME

(71) Applicants: CITIZEN ELECTRONICS CO., LTD., Yamanashi-Ken (JP); CITIZEN HOLDINGS CO., LTD., Tokyo (JP)

(72) Inventor: Atsushi Kanemaru, Yamanashi-ken (JP)

(73) Assignees: CITIZEN ELECTRONICS CO., LTD., Yamanashi-ken (JP); CITIZEN HOLDINGS CO., LTD., Tokyo (JP)

(*) Notice: Subject to any disclaimer, the term of this patent is extended or adjusted under 35 U.S.C. 154(b) by 0 days.

(21) Appl. No.: 14/869,049

(22) Filed: Sep. 29, 2015

(65) Prior Publication Data

US 2016/0020368 A1    Jan. 21, 2016

Related U.S. Application Data

(62) Division of application No. 13/906,488, filed on May 31, 2013, now Pat. No. 9,196,801.

(30) Foreign Application Priority Data

May 31, 2012    (JP) ................................. 2012-124874

(51) Int. Cl.
*H01L 33/54* (2010.01)
*H01L 33/56* (2010.01)
(Continued)

(52) U.S. Cl.
CPC ............... *H01L 33/56* (2013.01); *H01L 33/50* (2013.01); *H01L 33/502* (2013.01);
(Continued)

(58) Field of Classification Search
CPC ... H01L 27/15; H01L 27/153; H01L 27/156; H01L 33/48; H01L 33/50; H01L 33/507; H01L 33/508; H01L 33/52; H01L 33/54
See application file for complete search history.

(56) References Cited

U.S. PATENT DOCUMENTS

| 2002/0187570 A1* | 12/2002 | Fukasawa | ............... H01L 24/97 438/26 |
|---|---|---|---|
| 2004/0041165 A1 | 3/2004 | Fukasawa et al. | |
| 2005/0002194 A1 | 1/2005 | Kikuchi et al. | |
| 2008/0032142 A1 | 2/2008 | Tasumi et al. | |

FOREIGN PATENT DOCUMENTS

| JP | 2002368281 A | 12/2002 |
|---|---|---|
| JP | 2004304041 A | 10/2004 |

(Continued)

OTHER PUBLICATIONS

Japanese Notice for Reasons for Refusal for the Japanese counterpart patent application No. JP2012-124874 of Dec. 14, 2015.

*Primary Examiner* — Jae Lee
(74) *Attorney, Agent, or Firm* — Browdy and Neimark, PLLC

(57) ABSTRACT

In a first aspect of the present invention, a lighting device includes a light-emitting element, a frame including a phosphor that can be excited by light emitted from the light-emitting element, the frame having an inner side surface surrounding the light-emitting element and an outer side surface being positioned outside the inner side surface that demarcates a quadrilateral area, and a light-transmitting resin arranged in the quadrilateral area demarcated by the inner side surface of the frame and sealing the light-emitting element that is positioned inside the quadrilateral area, and the light-transmitting resin being further provided in contact with an outer side surface of the frame. In some embodiments, it is disclosed that the light-transmitting resin provided in contact with the outer side surface of the frame may include a diffuser.

6 Claims, 13 Drawing Sheets

(51) Int. Cl.
*H01L 33/50* (2010.01)
*H01L 33/60* (2010.01)
*H01L 33/48* (2010.01)

(52) U.S. Cl.
CPC ............ *H01L 33/507* (2013.01); *H01L 33/60* (2013.01); *H01L 33/486* (2013.01); *H01L 33/505* (2013.01); *H01L 2924/0002* (2013.01); *H01L 2933/005* (2013.01); *H01L 2933/0033* (2013.01); *H01L 2933/0041* (2013.01); *H01L 2933/0058* (2013.01)

(56) References Cited

FOREIGN PATENT DOCUMENTS

| | | |
|---|---|---|
| JP | 2008-60542 A | 3/2008 |
| JP | 2010-45248 A | 2/2010 |
| JP | 201045248 A | 2/2010 |
| JP | 2010045248 A | 2/2010 |
| JP | 2011-243977 A | 12/2011 |
| WO | 2009066430 A1 | 5/2009 |

* cited by examiner

LIGHTING DEVICE AND METHOD OF MANUFACTURING THE SAME

CROSS-REFERENCE TO RELATED APPLICATION

This application is based on and claims the priority benefit of Japanese Patent Application No. 2012-124874, filed on May 31, 2012, the disclosure of which is incorporated herein by reference in its entirety.

BACKGROUND OF THE INVENTION

1. Field of the Invention

The present invention relates to a lighting device including a light-emitting element and a phosphor layer that surrounds the light-emitting element, and also relates to a method of manufacturing a lighting device including a light-emitting element and a phosphor layer that surrounds the light-emitting element.

2. Description of the Related Art

It is laid open to the public that a light-emitting diode includes a light-emitting element, a circuit substrate on that the light-emitting element is mounted, a sealing resin that seals the light-emitting element on the circuit substrate, and a frame including a phosphor and disposed to surround the sealing resin (For reference, see Japanese Unexamined Patent Application Publication No. 2010-45248). Also, this Japanese Unexamined Patent Application Publication discloses that the light-emitting diode includes a reflecting sheet disposed on an upper surface of the sealing resin.

Regarding a reflecting sheet, there is another application publication, which also discloses a reflecting layer made of a metallic layer and disposed on an upper surface of the sealing resin (For reference, see Japanese Unexamined Patent Application Publication No. 2004-304041).

In addition, it is laid open to the public that a semiconductor light-emitting device includes a semiconductor light-emitting element, a submount to place the semiconductor light-emitting element thereon, a sealant to seal the semiconductor light-emitting element over the submount, and a reflective layer provided on a side surface of the sealant, provided that a light-emitting surface of the sealant is an upper surface (For reference, see International Patent Publication No. WO 2009/066430). Also, it is disclosed that the semiconductor light-emitting element of the semiconductor light-emitting device is coated with a phosphor layer. This International Patent Publication also discloses a method of manufacturing the semiconductor light-emitting device.

Furthermore, it is laid open to the public that a method for manufacturing light emitting diode devices with molded reflection frames collectively (For reference, see Japanese Unexamined Patent Application Publication No. 2002-368281).

SUMMARY OF THE INVENTION

In a first aspect of the present invention, a lighting device includes a light-emitting element, a frame including a phosphor that can be excited by light emitted from the light-emitting element, the frame having an inner side surface surrounding the light-emitting element and an outer side surface being positioned outside the inner side surface that demarcates a quadrilateral area, and a light-transmitting resin arranged in the quadrilateral area demarcated by the inner side surface of the frame and sealing the light-emitting element that is positioned inside the quadrilateral area, and the light-transmitting resin being further provided in contact with the outer side surface of the frame.

In some embodiments, it is disclosed that the light-transmitting resin provided in contact with the outer side surface of the frame may include a diffuser.

Also, it is disclosed that the outer side surface of the frame is covered by the light-transmitting resin.

In a second aspect of the present invention, a method manufacturing a lighting device includes; mounting light-emitting elements on a substrate assembly and electrically connecting the light-emitting elements to the substrate assembly; sealing the light-emitting elements on the substrate assembly by a light-transmitting resin to form a light-transmitting resin assembly; dicing the light-transmitting resin assembly vertically and horizontally to form grooves that surrounds the light-emitting elements; and filling a phosphor-containing resin into the grooves to form a frame assembly that includes frames of the phosphor-containing resin and to form a light-transmitting assemblage.

BRIEF DESCRIPTION OF THE DRAWINGS

FIG. 9A to FIG. 9E show a second method embodiment according to method of manufacturing a lighting device related to the lighting device shown in FIG. 5.

FIG. 9A to FIG. 9E' (instead of 9E) show a third method embodiment according to method of manufacturing a lighting device related to the lighting device shown in FIG. 7.

DETAILED DESCRIPTION OF THE EMBODIMENTS

Figure 1:
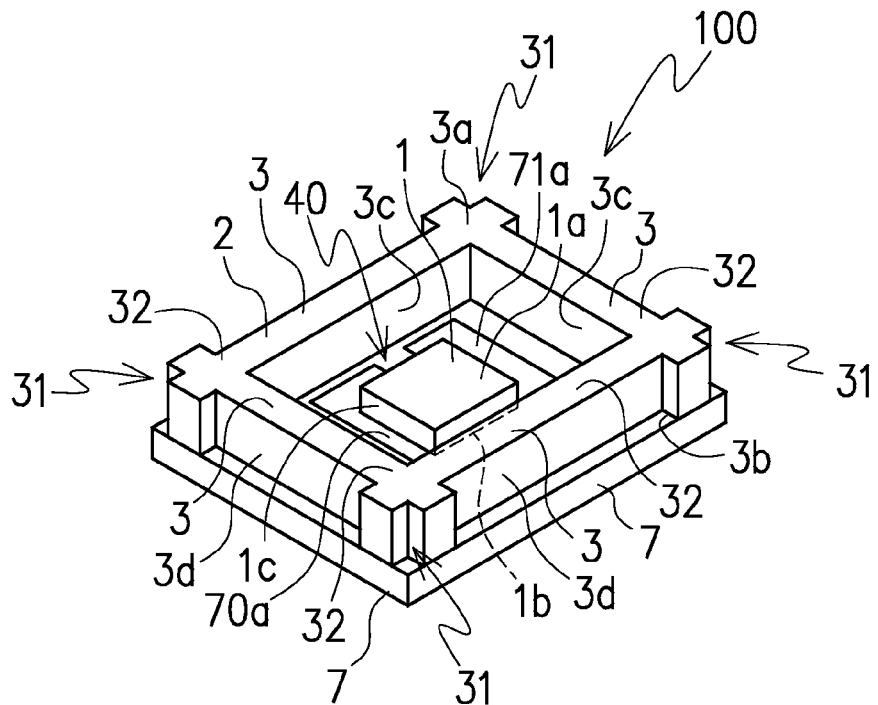
FIG. 1 is a schematic perspective view of a lighting device related to a first embodiment and a second embodiment of the present invention.

As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes", "including", "has" and/or "having" when used herein, specify the presence of stated features, integers, steps, operations, elements, components, and/or portions of an element, but do not preclude the presence or addition of one or more other features, integers, steps, operations, elements, components, portions, and/or groups thereof.

Furthermore, as used herein, the term "light-emitting element" may be used as a light-emitting diode (LED) element including a first electrode and a second electrode as a bare chip in some embodiments. The bare chip may be a wafer-level chip. The term "light-emitting element" may be used as an LED element electrically connected to a lead-frame. In other embodiments, the term "light-emitting element" may be used as an LED package including one or more LED elements arranged on a substrate. Also, it is possible to replace a light-emitting element shown in an embodiment of the present invention by an LED package, for example.

Furthermore, as used herein, the term "frame" is herein used to indicate a frame including a phosphor that can be excited by light emitted from a light-emitting element.

Relative terms such as "below" or "above" or "upper" or "lower" or "top" may be used herein to describe a relationship of one element, layer or region to another element, layer or region as illustrated in the figures. It will be understood that these terms are intended to encompass different orientations of a device in addition to the orientation depicted in the figures.

A lighting device according to an embodiment of the present invention includes a light-emitting element, a frame including a phosphor that can be excited by light emitted from the light-emitting element and surrounding the light-emitting element. The frame has an inner side surface surrounding the light-emitting element and an outer side surface that is positioned outside of the inner side surface. The inner side surface and the outer side surface of the frame are positioned opposite to each other. The lighting device according to an embodiment of the present invention further includes a light-transmitting resin arranged in contact with the inner side surface of the frame and arranged in contact with the outer side surface of the frame.

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Embodiments of the invention are described with reference to drawings included herewith. Same and/or similar reference numbers refer to same and/or similar structures throughout. It should be noted that the drawings are schematic in nature.

FIG. 1 shows a schematic perspective view of a lighting device 100, which is related to a first embodiment and a second embodiment of the present invention.

The lighting device 100 includes a light-emitting element 1, a frame 3 including a phosphor 2 that can convert light emitted from the light-emitting element 1. The phosphor can be excited by light emitted from a light-emitting element 1 and can emit light in area of spectrum different from area of spectrum of light emitted from the light-emitting element 1.

The frame 3 has an inner side surface 3c surrounding the light-emitting element 1 and an outer side surface 3d that is positioned outside the inner side surface 3c. For more details, the inner side surface 3c and the outer side surface 3d of the frame 3 are positioned opposite to each other. The frame 3 includes a phosphor layer 32 that may have a rectangular shape when viewed from a side of a lighting device 100. The phosphor layer 32 may have a linear shape when viewed from top of the lighting device 100. The frame 3 in this embodiment further may include a crossing portion 31 at a corner of the frame 3. The crossing portion 31 of the frame 3 is a portion where two phosphor layers 32 cross each other. The crossing portion 31 may be provided at a corner of the frame 3. The frame 3 may be a combination of four phosphor layers 32. That is, two pairs of parallel phosphor layers 32 crisscrossing to form a quadrilateral shape.

In this embodiment, the frame 3 includes four phosphor layers 32 demarcating a quadrilateral area 40 with the light-emitting element 1 centered when viewed from above.

The light-emitting element 1 can be selected from light-emitting elements that emit various color of light. For example, the light-emitting element 1 may be a blue light-emitting element. It is possible to arrange an ultraviolet light-emitting element as the light-emitting element 1. Furthermore, the light-emitting element can be a red light-emitting element, a green light-emitting element or a yellow light-emitting element. A phosphor 2 that can be excited by light emitted from the light-emitting element 1 may be selected and used in the frame 3. For example, when a blue light-emitting element 1 is used as the light-emitting element 1, a YAG (yttrium aluminum garnet) phosphor that can be excited by light emitted from the blue light-emitting element may be used, however, various combinations of a light-emitting element and a phosphor that includes RGB (red green blue) phosphor are available.

The quadrilateral area 40 may be a square area or a rectangular area. The light-emitting element 1 is arranged in a center of quadrilateral area 40. In this embodiment, the frame 3 includes four crossing portions 31 positioned at four corners of the frame 3. FIG. 1 is used to explain a configuration of a lighting device related to a first embodiment and a second embodiment according to the present invention.

Also, the lighting device 100 may include a light-transmitting resin 4 arranged in the quadrilateral area 40 demarcated by the inner side surface 3c of the frame 3. The light-emitting element 1 positioned inside the quadrilateral area 40 and sealed by the light-transmitting resin 4. The light-transmitting resin 4 in this embodiment is made of a transparent or translucent resin without a phosphor 2. The light-transmitting resin 4 may be further arranged in contact with an outer side surface 3d of the frame 3.

Accordingly, the phosphor layers 32 of the frame 3 are covered by the light-transmitting resin 4 at the inner side surface 3c and the outer side surface 3d of the frame 3. With this configuration, it may be possible to prevent the frame 3 including a phosphor 2 from being gradually affected by exposure to air. Light emitted from the light-emitting element 1 is configured to pass through the frame 3 from the inner side surface 3c to the outer side surface 3d of the frame 3. The inner side surface 3c of the frame 3 may include four inner side surfaces 3c with the four phosphor layers 32 around the light-emitting element 1. Also, the outer side surface 3d may include four outer side surfaces 3d with the four phosphor layers 32 positioned outside of the four inner side surfaces 3c.

It is possible to arrange the phosphor layers 32 that are positioned to face the peripheral side surface 1c of the light-emitting element 1 to have a substantially same thickness to each other in direction facing the peripheral side surface 1c of the light-emitting element 1.

Furthermore, as a variation, the light-transmitting resin 4 that is provided in contact with the outer side surface 3d of the frame 3 may include a diffuser. The diffuser used in the light-transmitting resin 4' that is provided in contact with the outer side surface 3d of the frame 3 can be any solid particle that is known to diffuse light more efficiently. The diffusing particle may be made of silicon dioxide ($SiO_2$), for example. Also, titanium dioxide ($TiO_2$) may be used as a diffusing particle. The light-transmitting resin provided in contact with the outer side surface 3d of the frame 3 and includes the diffuser is shown as 4' in FIG. 4.

Accordingly, light emitted laterally out of the phosphor layer of the frame 3 can be diffused by the diffuser included in the light-transmitting resin 4' that is provided in contact with the outer side surface 3d of the frame 3 efficiently.

Also, it is possible to arrange a distance between the inner side surface 3c of the frame 3 and the peripheral side surface 1c of the light-emitting element 1 to be constant.

Accordingly, it may be possible to suppress the occurrence of variations of light emitted through the phosphor layers 32 of the frame 3 in lateral directions.

Figure 3:
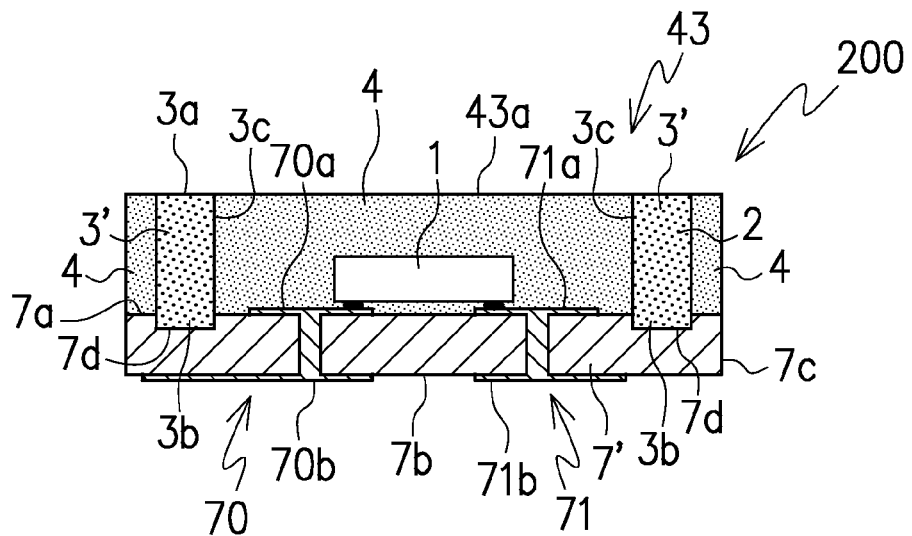
FIG. 3 is a cross-sectional view taken along a line III-III of the lighting device shown in FIG. 2.

The lighting device may further include a substrate 7 on that the light-emitting element 1 can be mounted. The substrate 7 may include a pair of electrodes 70, 71. The first electrode 70 may include a first upper electrode 70a arranged on an upper surface 7a of the substrate 7 and a first lower electrode 70b arranged on a lower surface 7b of the substrate 7, as shown in FIG. 3. The first upper electrode 70a and the first lower electrode 70b may be electrically connected by a first through-hole 70c. Also, the second electrode 71 may include a second upper electrode 71a arranged on the upper surface 7a of the substrate 7 and a second lower electrode 71b may be electrically connected by a second through hole 71c. The light-emitting element 1 may be electrically mounted on the first upper electrode 70a and the second upper electrode 71a through bumps. It is possible to electrically mount the light-emitting element 1 on the upper surface 7a of the substrate 7 by wires. However, when laterally emitted light is considered to be used, a light-emitting element 1 at its lower surface 1b mounted on a substrate through bumps may be more efficient, compared with a light-emitting element electrically connected to the substrate by a metallic wire that may extend from an upper surface 1a of the light-emitting element 1 to an electrode on a substrate, because the bumps disposed at the lower surface 1b of the light-emitting element 1 are considered not to interrupt light emitted upward and/or laterally from the light-emitting diode element 1.

The light-transmitting resin 4 sealing the light-emitting element 1 and the frame 3 including a phosphor 2 form a light-emitting parallelepiped 43 on the substrate 7. The upper surface 3a of the frame 3 and the upper surface of the light-transmitting resin 4 are flush with each other to form an upper surface 43a of the light-emitting parallelepiped 43. Also, the peripheral side surface of the light-transmitting resin 4 and a peripheral side surface 7c of the substrate 7 may be flush with one another. The inner side surface 3c and the outer side surface 3d of the frame 3' are covered by the light-transmitting resin 4.

Figure 2:
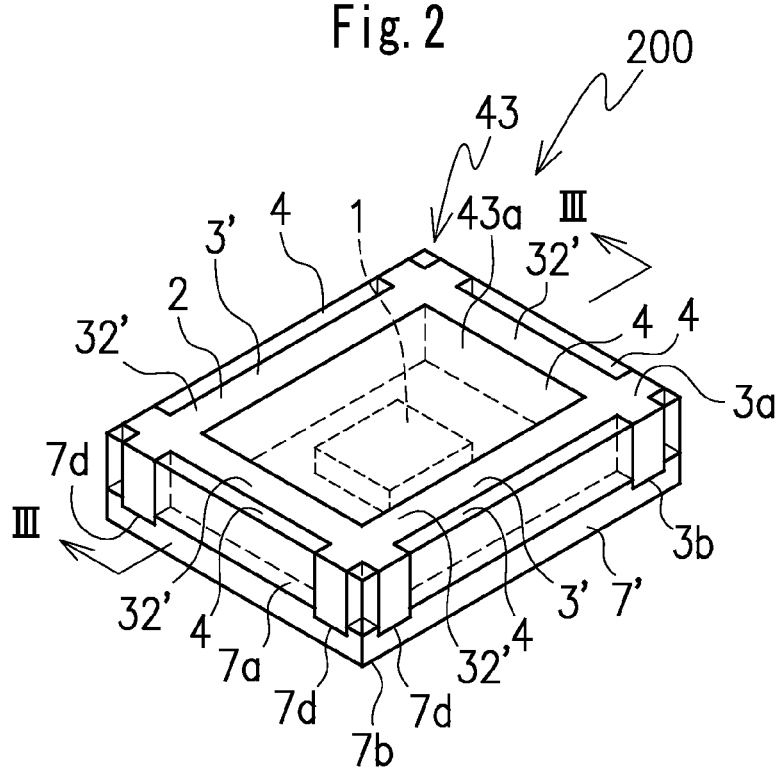
FIG. 2 is a top perspective view of a lighting device according to the second embodiment of the present invention.

As shown in FIG. 2 and FIG. 3, the substrate 7' may include a cut portion 7d that is cut into an upper surface 7a of the substrate 7'. In this case, the cut portion 7d may have a shape corresponding to a lower surface 3b of the frame 3'. The frame 3' includes phosphor layers 32' that are positioned to face the peripheral side surface 1c of the light-emitting element 1.

Accordingly, the lower surface 3b of the phosphor layers 32' of the frame 3' can be positioned in the cut portion 7b of the substrate 7'. This configuration may enhance structural integrity of the phosphor layers 32' of the frame 3', the substrate 7' and the light-transmitting resin 4 arranged inside the frame 3' and/or the light-transmitting resin 4 (4') arranged outside the frame 3'.

Figure 4:
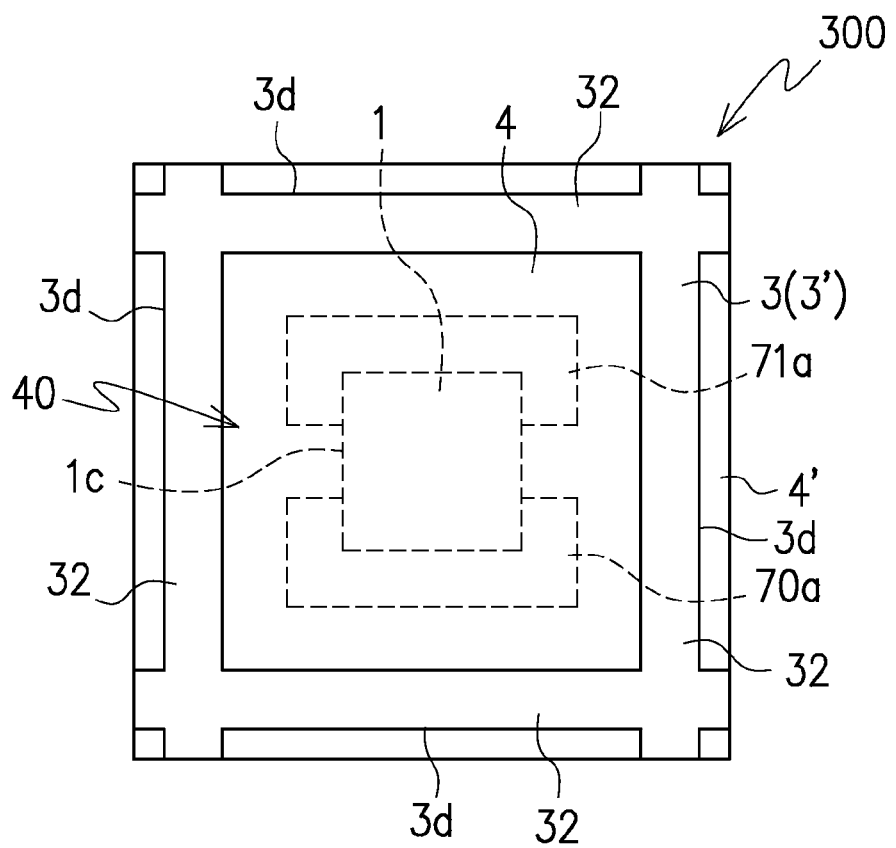
FIG. 4 is a top plan view of a lighting device related to the first embodiment and the second embodiment of the present invention.

FIG. 4 shows a top plan view of a lighting device 300 that can be according to the first embodiment and/or the second embodiment. The light-emitting element 1 is arranged in a center of quadrilateral area 40. The quadrilateral area 40 includes a square area. The frame 3 (3') includes phosphor layers 32 that are positioned to face the peripheral side surface 1c of the light-emitting element 1 to have substantially same thickness to each other in direction facing the peripheral side surface 1c of the light-emitting element 1. The term "substantially same thickness" here includes manufacturing variations of thickness. Furthermore, the light-transmitting resin 4 (here shown as 4') provided in contact with the outer side surface 3d of the frame 3 (3') may include a diffuser. With this configuration, lateral light emitted through the phosphor layer can be diffused effectively.

Figure 5:
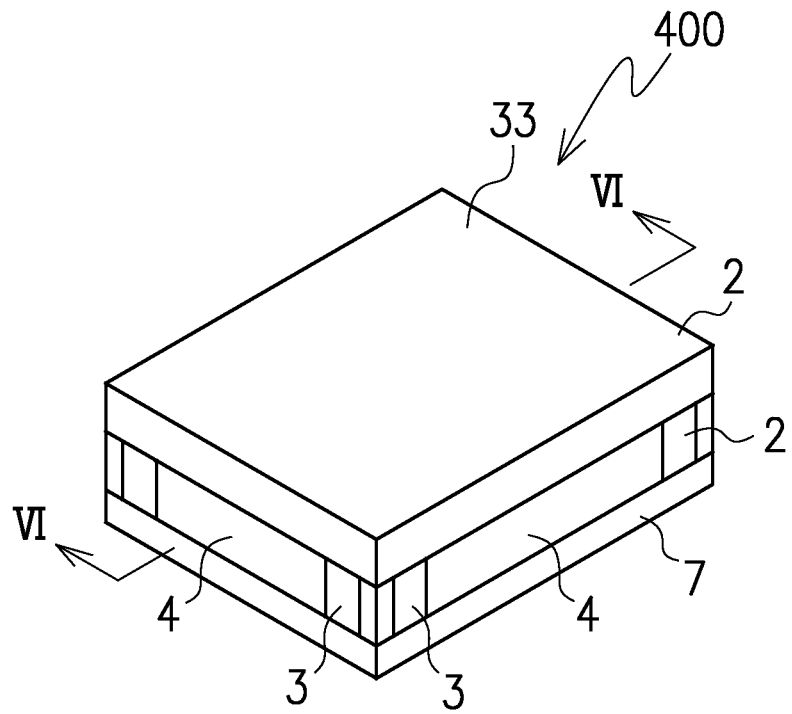
FIG. 5 is a top perspective view of a lighting device according to a third embodiment of the present invention.
Figure 6:
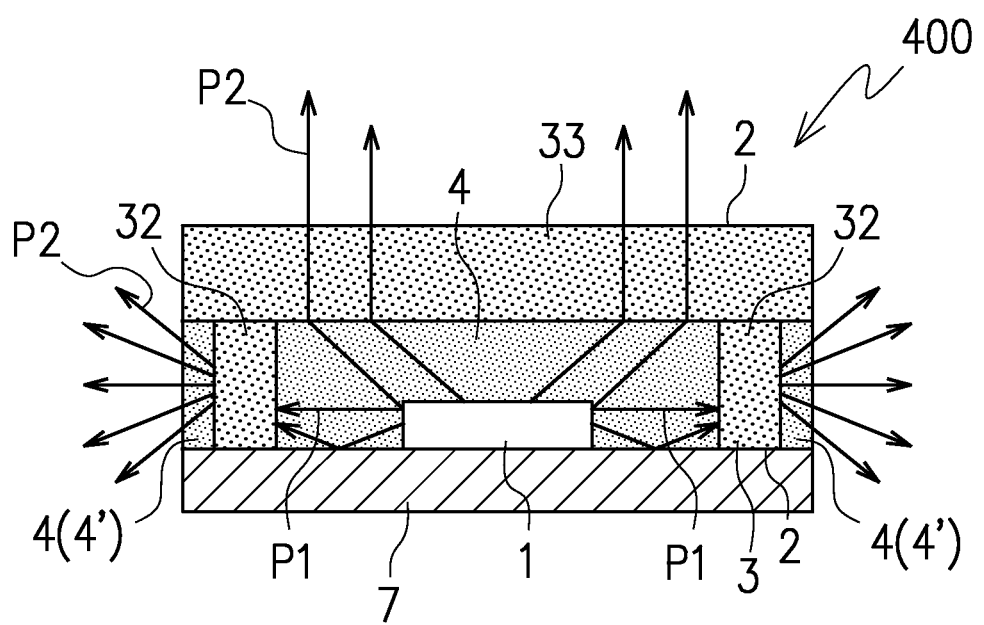
FIG. 6 is a cross-sectional view taken along a line VI-VI of the lighting device shown in FIG. 5.

FIG. 5 shows a top perspective view of a lighting device 400 according to a third embodiment of the present invention, and FIG. 6 is a cross-sectional view taken along a line VI-VI of the lighting device 400 shown in FIG. 5. In this third embodiment, the lighting device 400 further includes a phosphor layer 33 that includes a phosphor 2 and that is disposed on an upper surface 43a of the light-emitting parallelepiped 43 formed by the light-transmitting resin 4 and the frame 3 on the substrate 7. The lower surface 3b of the frame 3 that includes a phosphor 2 may be in contact with an upper surface 7a of the substrate 7 similarly to the first embodiment or may be positioned in a cut portion 7b of the substrate 7' similarly to the second embodiment. The lighting device 400 according to this embodiment can be configured to emit laterally from the four phosphor layers 32 that surround the light-emitting element 1 and also upwardly through the phosphor layer 33 that is disposed on the upper surface 43a of the light-emitting parallelepiped 43. FIG. 6 also shows directions of light roughly: P1 shows light emitted from the light-emitting element 1 and P2 shows light after being transmitted through a phosphor layer 32 and/or a phosphor layer 33.

Figure 7:
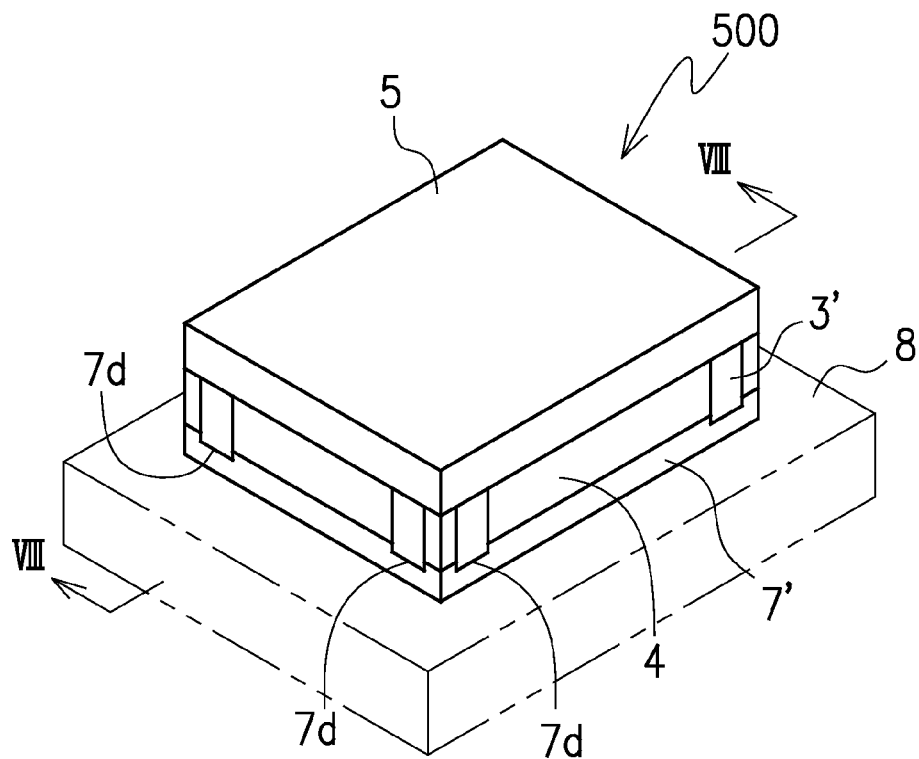
FIG. 7 is a top perspective view of a lighting device according to a fourth embodiment of the present invention.
Figure 8:
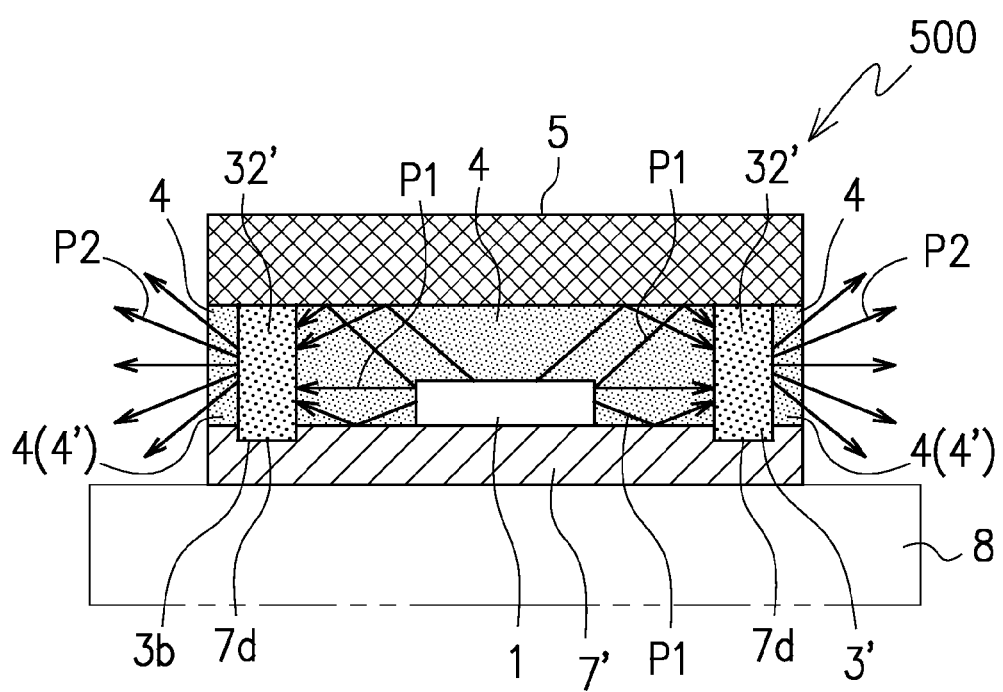
FIG. 8 is a cross-sectional view taken along a line VIII-VIII of the lighting device shown in FIG. 7.

FIG. 7 shows a top perspective view of a lighting device 500 according to a fourth embodiment of the present invention and FIG. 8 shows a cross-sectional view taken along a line VIII-VIII of the lighting device 500 shown in FIG. 7.

In this fourth embodiment, the lighting device 500 further includes a light-reflecting layer 5 that is disposed on an upper surface 43a of the light-emitting parallelepiped 43 formed by the light-transmitting resin 4 and the frame 3 on the substrate 7'. The light-reflecting layer 5 is configured to reflect light that is emitted upward from the light-emitting element 1. The reflected light by the light-reflecting layer 5 may be used as lateral light emitted from the lighting device 500 with the light-reflecting layer 5. The light-reflecting layer 5 can be provided, when light emitted upward from the light-emitting device 500 is unnecessary.

FIG. 8 also shows directions of light roughly: P1 shows light emitted from the light-emitting element 1 and P2 shows light after being transmitted through a phosphor layer 32'.

The lower surface 3b of the frame 3 may be in contact with an upper surface 7a of the substrate 7 similarly to the first embodiment or the lower surface 3b of the frame 3' may be positioned in a cut portion 7b of the substrate 7' similarly to the second embodiment. The lighting device 500 according to the fourth embodiment can be configured to emit light laterally from the four phosphor layers 32' that surround the light-emitting element 1 efficiently. The light-emitting device 500 may be electrically disposed on a motherboard 8 (shown as dotted line) of an electronic device or a lighting system.

FIG. 9A to FIG. 9D show a first method embodiment according to method of manufacturing a lighting device related to the first embodiment of lighting device and the second embodiment of lighting device of the present invention. The substrate 7 may include a pair of electrodes 70, 71, similarly to the substrate 7 shown in FIG. 3.

In this embodiment, the method manufacturing a lighting device includes mounting a light-emitting element 1 on a substrate 7 and electrically connected to the substrate 7, sealing the light-emitting element 1 on the substrate 7 by a light-transmitting resin 4, dicing the light-transmitting resin 4 vertically and horizontally to form a groove 30 that surrounds the light-transmitting element 1, and filling a phosphor-containing resin into the groove 30 to form a frame 3 of the phosphor-containing resin. The light-emitting element 1 may be electrically connected to a first upper electrode 70a and a second upper electrode 71a of the pair of electrodes 70, 71 of the substrate 7 by bumps, for example.

The grooves 30 may be formed to reach to an upper surface 7a of the substrate 7. In a variation, the grooves 30 may be formed to be cut into an upper surface 7a of the substrate 7.

Figure 9A:
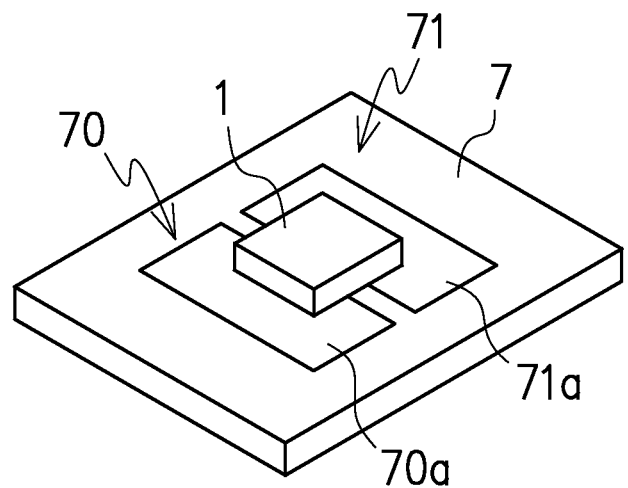
FIG. 9A to FIG. 9D show a first method embodiment according to method of manufacturing a lighting device related to the first embodiment of lighting device and the second embodiment of lighting device of the present invention.
Figure 9B:
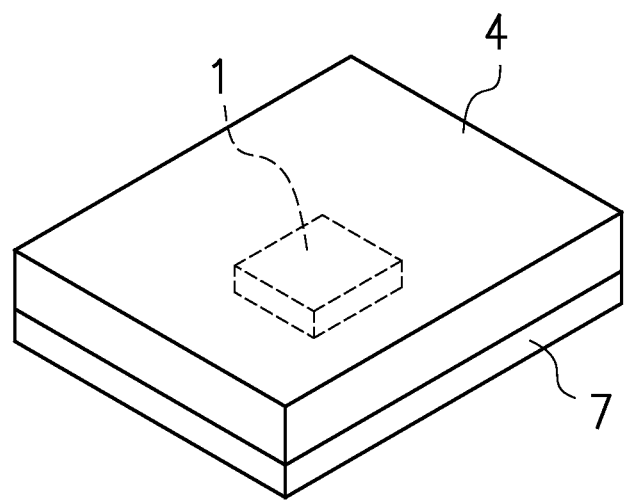
Figure 9C:
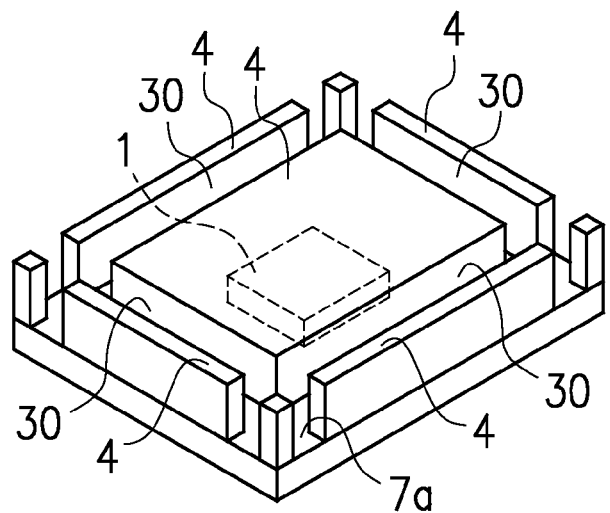
Figure 9D:
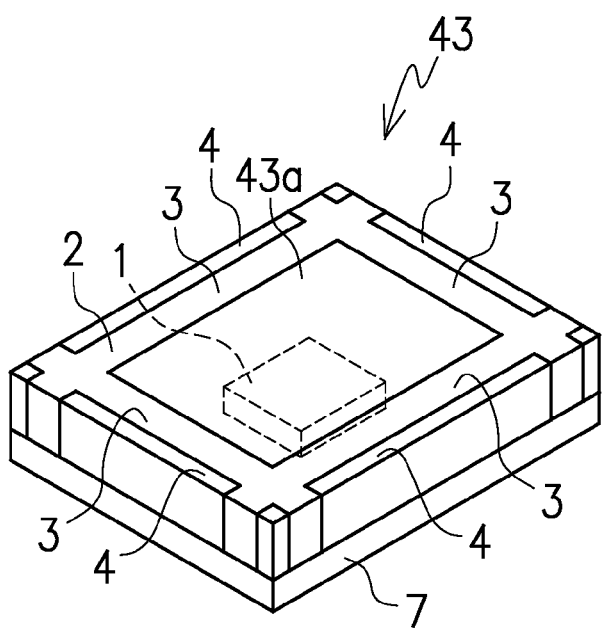
Figure 9E:
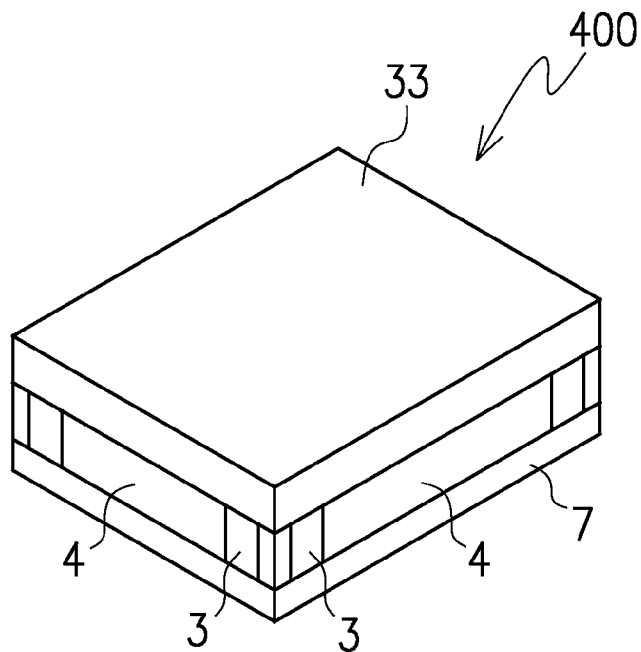
Figure 9E:
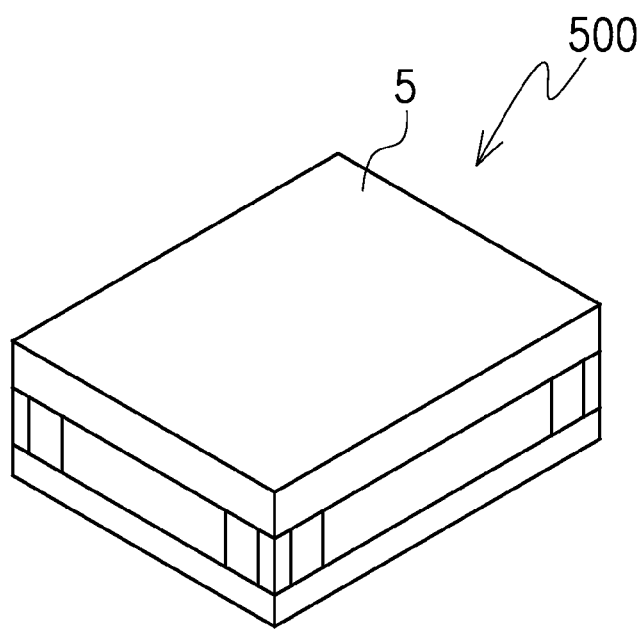

For more details, FIG. 9A shows the light-emitting element 1 being mounted on the substrate 7. The light-emitting element 1 can be electrically connected to electrodes 70, 71 of the substrate 7 by a wire and/or a bump when the light-emitting element 1 is mounted on the substrate 7. Also, the substrate 7 here can be a lead frame to which the light-emitting element 1 is electrically connected. FIG. 9B shows the light-emitting element 1 being sealed by the light-transmitting resin 4. FIG. 9C shows the light-transmitting resin 4 being diced to form grooves 30 surrounding the light-emitting elements 1. The grooves 30 cut into the light-transmitting resin 4 includes a quadrilateral shape when viewed from above. FIG. 9D shows a lighting device with a frame 3 after the grooves 30 that are cut through the light-transmitting resin 4 are filled by a phosphor-containing resin 3. If the grooves 30 are provided to cut through the light-transmitting resin 4 and cut into an upper surface 7a of the substrate 7, the lighting device manufactured according to this method can be the lighting device 200 shown in FIG. 2. The grooves 30 filled with the phosphor-containing resin are configured to be a frame 3 of the lighting device. The lighting device can be configured to emit light laterally through a phosphor layer 32 and emit light upward without passing through a phosphor layer 32. With this configuration, since the light-emitting element 1 at its peripheral side surface 1c is surrounded by the phosphor layers 32, the lighting device may emit different color of light depending on its directions (in an upward direction and in a lateral direction of the lighting device).

Also, FIG. 9A to FIG. 9E show a second method embodiment according to method of manufacturing a lighting device related to the lighting device shown in FIG. 5.

In this embodiment, the method manufacturing a lighting device 400 includes mounting a light-emitting element 1 on a substrate 7 and electrically connected to the substrate 7, sealing the light-emitting element 1 on the substrate 7 by a light-transmitting resin 4, dicing the light-transmitting resin 4 vertically and horizontally to form grooves 30 that surrounds the light-transmitting element 1, filling a phosphor-containing resin into the grooves 30 to form a frame 3 of the phosphor-containing resin, and disposing a phosphor layer 33 on an upper surface 43a of a light-emitting parallelepiped 43 formed by the light-transmitting resin 4 and the frame 3.

The upper surface 43a of the light-emitting parallelepiped 43 is formed by the upper surface of the light-transmitting resin and the upper surface of the frame 3 that are flush with each other. The phosphor layer 33 can be formed on the upper surface 43a of the light-emitting parallelepiped 43 by printing a phosphor-containing resin. Instead, it is possible to arrange a phosphor layer 33 in a form of plate on the upper surface 43a of the light-transmitting resin and the upper surface of the grooves 30 filled by the phosphor-containing resin 3.

FIG. 9A to FIG. 9E' (instead of 9E) show a third method embodiment according to method of manufacturing a lighting device related to the lighting device shown in FIG. 7.

The lighting device can be manufactured to emit light laterally through a phosphor layer 32. The lighting device including a light-reflecting layer 5 can use upward light as laterally emitted light. In this embodiment, the method manufacturing a lighting device 500 includes mounting a light-emitting element 1 on a substrate 7 and electrically connected to the substrate 7, sealing the light-emitting element 1 on the substrate 7 by a light-transmitting resin 4, dicing the light-transmitting resin 4 vertically and horizontally to form grooves 30 that surround the light-transmitting element 1, filling a phosphor-containing resin into the grooves 30 to form a frame 3 of the phosphor-containing resin, and disposing a light-reflecting layer 5 on an upper surface of a light-emitting parallelepiped 43 formed by the light-transmitting resin 4 and the frame 3.

Figure 10:
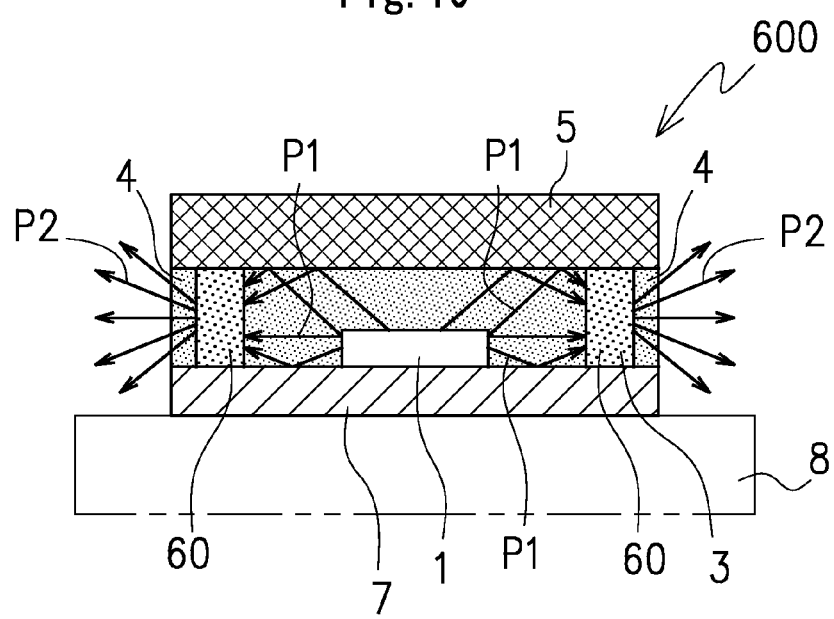
FIG. 10 is a cross-sectional view of a lighting device according to a fifth embodiment of the present invention.

FIG. 10 is a cross-sectional view of a lighting device 600 according to a fifth embodiment of the present invention.

Figure 11:
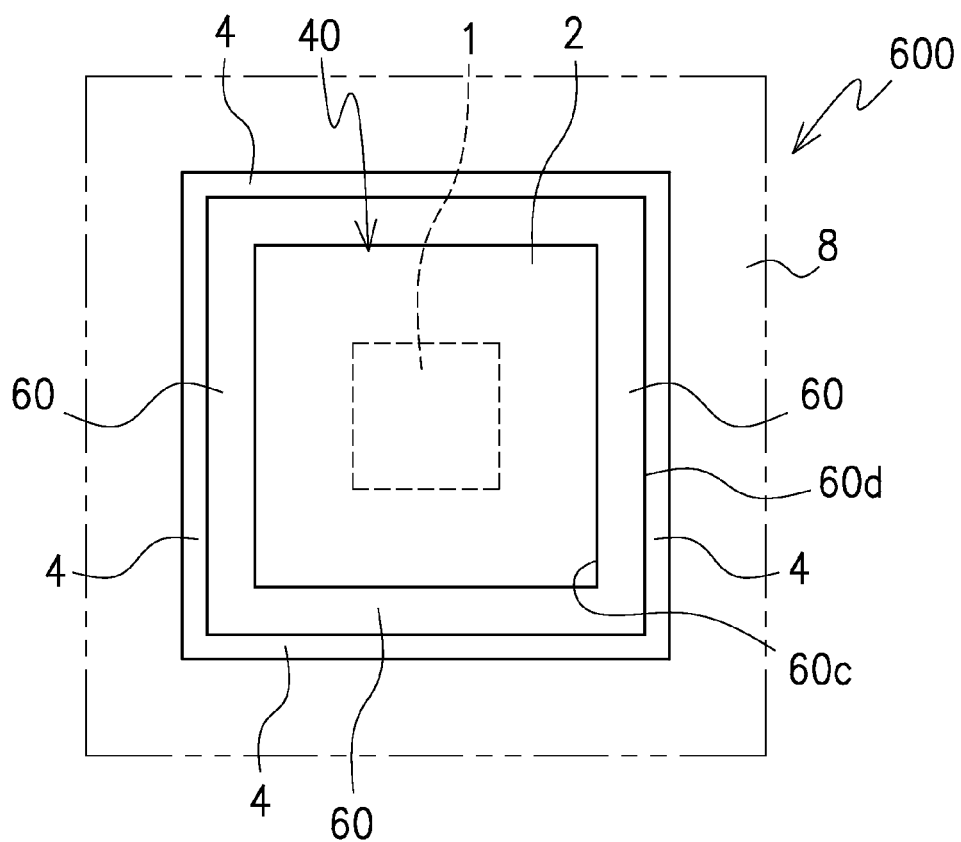
FIG. 11 is a top plan view of the lighting device shown in FIG. 10 with the light-reflecting layer removed.

FIG. 11 is a top plan view of the lighting device 600 shown in FIG. 10 with the light-reflecting layer 5 removed.

The lighting device 600 includes a light-emitting element 1, a frame 60 including a phosphor 2 that can be excited by light emitted from the light-emitting element 1.

The frame 60 has an inner side surface 60c surrounding the light-emitting element 1 and an outer side surface 60d that is positioned outside the inner side surface 60c. The inner side surface 60c that demarcates a quadrilateral area 40. The lighting device 600 further includes a light-transmitting resin 4 arranged in the quadrilateral area 40 demarcated by the inner side surface 60c of the frame 3 and sealing the light-emitting element 1 that is positioned inside the quadrilateral area 40. The light-transmitting resin 4 being further provided in contact with an outer side surface 60d of the frame 60. The light-transmitting resin 4 that is arranged in the quadrilateral area 40 demarcated by the inner side surface 60c of the frame 3 and the light-transmitting resin 4 provided in contact with the outer side surface 60d of the frame 60 are separated from each other by the frame 60.

As shown in FIG. 10, two pairs of parallel phosphor layers 62 form the frame 60 of a quadrilateral shape without a crossing portion, and the phosphor layers 62 of the frame 60 are entirely sealed by the light-transmitting resin 4. The frame 60 may be embedded in the light-transmitting resin 4.

Furthermore, the light-transmitting resin 4 provided in contact with the outer side surface 60d of the frame 60 may include a diffuser. With this configuration, lateral light emitted through the phosphor layer can be diffused effectively. To achieve this configuration, light-transmitting resin 4' provided in contact with the outer side surface 3d of the frame 3 may be formed separately from the light-transmitting resin 4 filled inside the frame 60.

FIG. 12A to 12D show a fourth method embodiment according to method of manufacturing a lighting device related to the lighting device shown in FIG. 10 and FIG. 11. The method of this embodiment includes mounting a light-emitting element 1 on a substrate 7, forming a frame that includes a phosphor to surround the light-emitting element 1, and sealing the frame 60 and the light-emitting element 1 on the substrate 7.

Figure 12A:
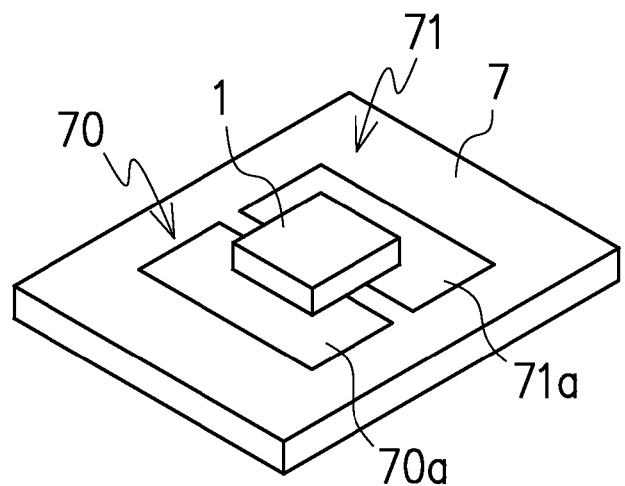
FIG. 12A to FIG. 12D show a fourth method embodiment according to method of manufacturing a lighting device related to the lighting device shown in FIG. 10 and FIG. 11.

For more details, FIG. 12A shows a light-emitting element 1 mounted on an upper surface of the substrate 7. The substrate 7 can include a pair of electrodes 70, 71 similarly to the lighting device 200 shown in FIG. 3. When the light-emitting element 1 is mounted on the substrate 7, the light-emitting element may be electrically connected to the pair of electrodes 70, 71 by a bump and/or metallic wire. The shape and/or number of electrodes can be changed, and use of lead frame instead of use of substrate is also available, and that are not limited to embodiments.

Figure 12B:
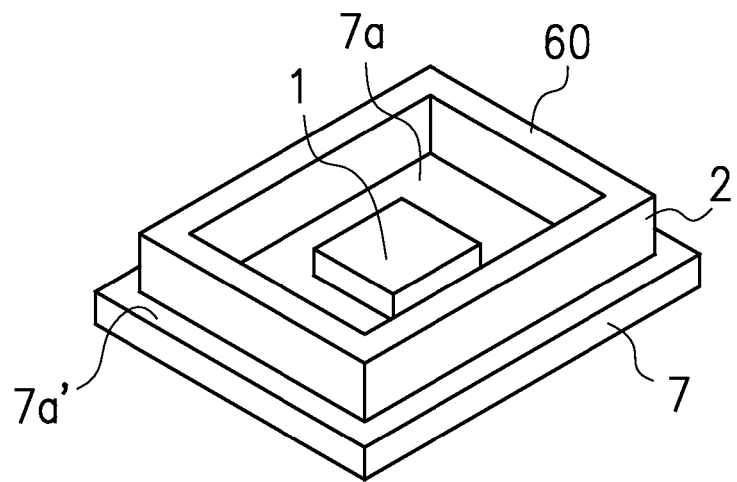

FIG. 12B shows that a frame 60 including a phosphor 2 may be formed by use of a molding die. The frame 60 can be formed to surround the light-emitting element 1 on the substrate 7. The frame 60 that is arranged on an upper surface 7a of the substrate 7 is positioned inside a peripheral upper surface portion 7a' of the frame 60.

Figure 12C:
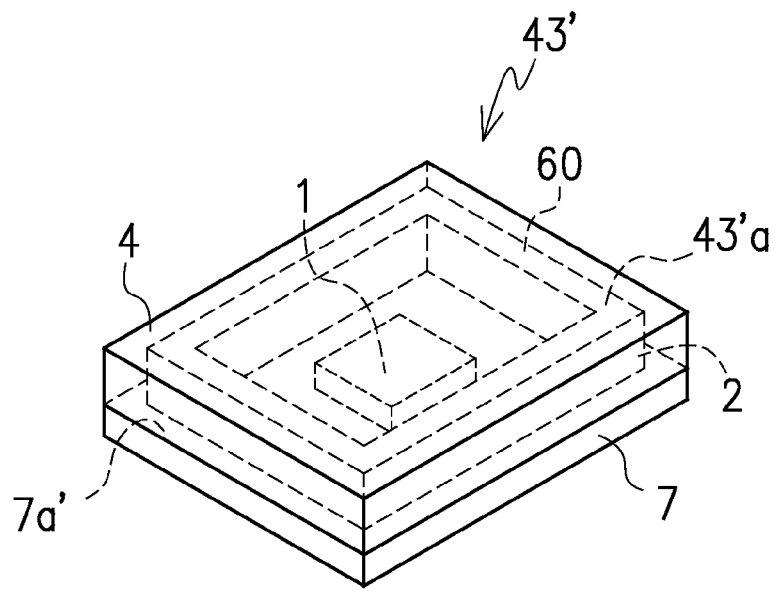

FIG. 12C shows that the frame 60 and the light-emitting element 1 are sealed by the light-transmitting resin 4. The light-transmitting resin 4 may be formed by use of a molding die. Also, it is possible to form the light-transmitting resin 4 inside the frame 60 and outside the frame 60 separately. The light-transmitting resin 4 outside the frame 60 can include a diffuser to form a light-transmitting parallelepiped 43'.

Figure 12D:
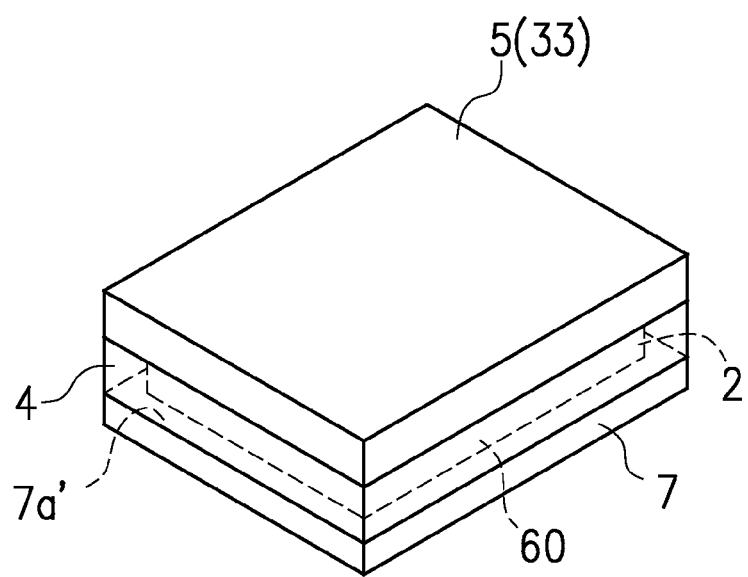
Figure 13A:
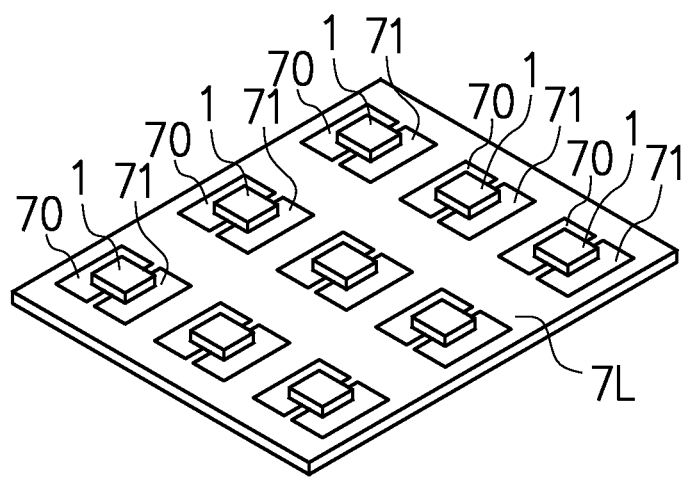
FIG. 13A to 13F show a fifth method embodiment according to method manufacturing a lighting device collectively.
Figure 13B:
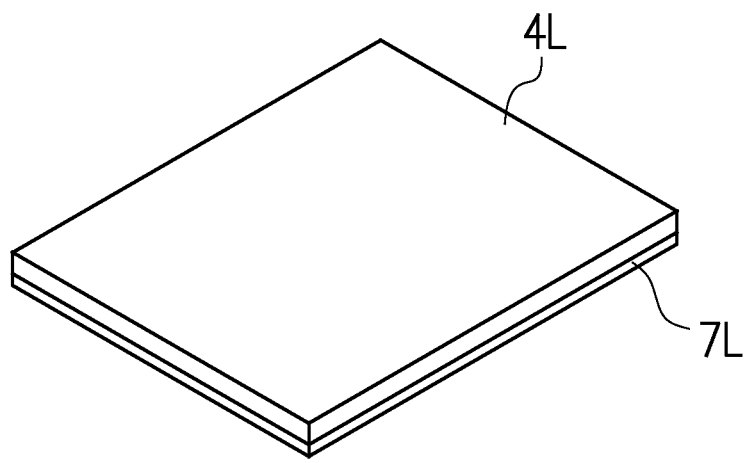
Figure 13C:
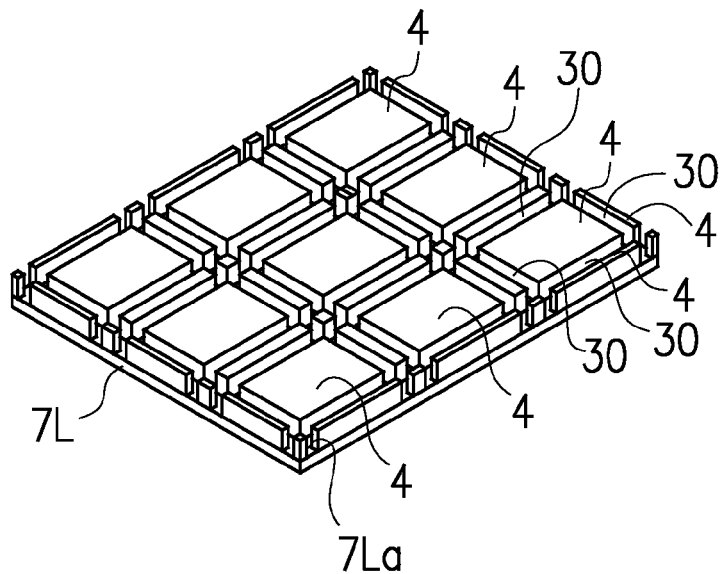
Figure 13D:
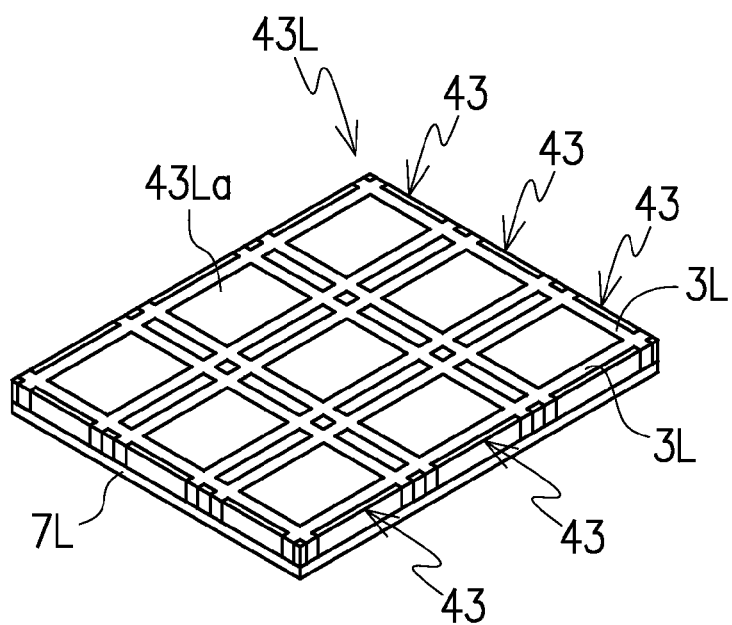
Figure 13E:
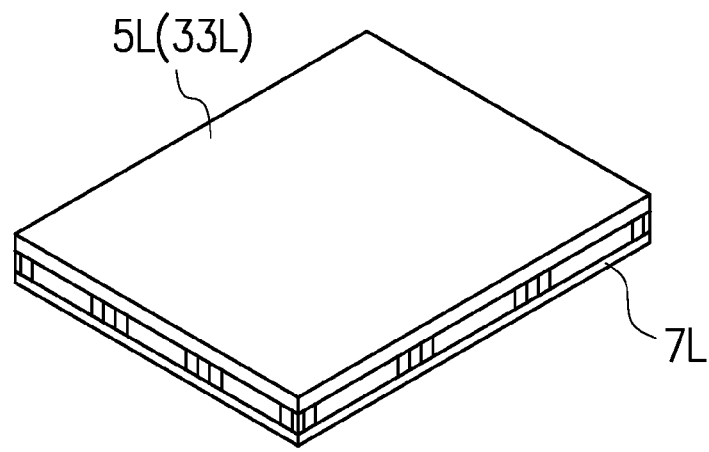
Figure 13F:
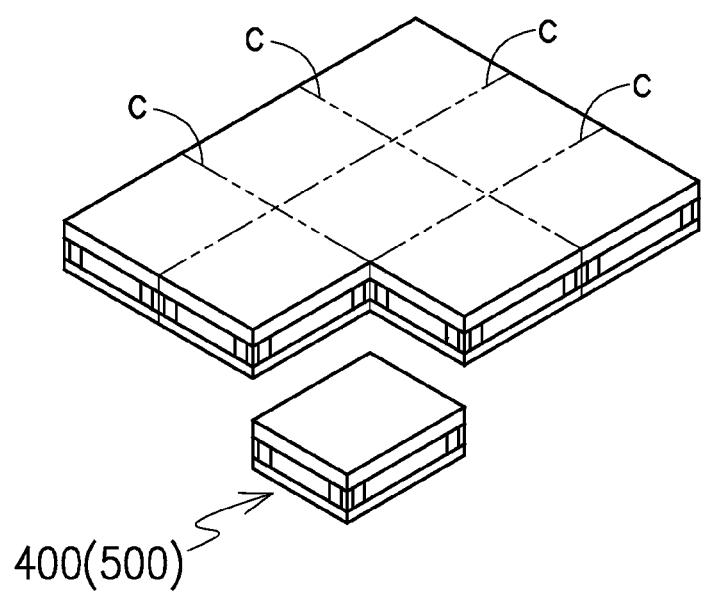

FIG. 12D shows that a light-reflecting layer 5 or a phosphor layer 33 being formed on an upper surface 43'a of the light-transmitting parallelepiped 43' of the light-transmitting resin 4.

FIG. 13A to 13F show a fifth method embodiment according to method manufacturing a lighting device collectively. The method manufacturing a lighting device comprising of this embodiment includes mounting light-emitting elements 1 on a substrate assembly 7L, sealing the light-emitting elements 1 on the substrate assembly 7L by a light-transmitting resin to form a light-transmitting resin assembly 4L, dicing the light-transmitting resin assembly 4L vertically and horizontally to form grooves 30 that surrounds the light-emitting elements 1, and filling a phosphor-containing resin into the grooves 30 to form a frame assembly 3L that comprises frames 3 of the phosphor-containing resin.

The substrate assembly 7L includes an electrode pattern and can be divided into substrates 7 each of that can have a quadrilateral shape with a pair of electrodes 70, 71. When the light-emitting elements 1 are mounted on the substrate assembly 7L, the light-emitting elements 1 can be electrically connected to the pair of electrodes 70, 71 that is included in the electrode pattern arranged on the substrate assembly 7L.

The method of this embodiment may further include dicing through the light-transmitting resin assembly 4L and the substrate assembly 7L at positions between the frames 3 of the frame assembly 3L to divide into lighting devices with the frames 3.

When the light-transmitting resin assembly 4L is diced through, an upper surface 7La of the substrate assembly 7L may be diced into to form a cut portion 7d (as shown in FIG. 2 and FIG. 3). The light-transmitting resin 4L is diced vertically and horizontally to form grooves, and cut portion 7d cut into the upper surface 7La of the substrate assembly 7L are simultaneously formed at the grooves.

Furthermore, the method may further includes forming a phosphor layer assembly 33L on an upper surface 43La of the light-transmitting assemblage 43L of the light-transmitting resin assembly 4L with the frame assembly 3L, and dicing through the phosphor layer assembly 33L, the light-transmitting assemblage 43L of the light-transmitting resin assembly 4L with the frame assembly 3L and the substrate assembly 7L at positions c between the frames 3 of the frame assembly 3L to divide into lighting devices 400 with the frames 3 and phosphor layers 33.

As a variation, the method may further includes forming a light-reflecting layer assembly 5L on an upper surface 43La of the light-transmitting assemblage 43L of the light-transmitting resin assembly 4L with the frame assembly 3L, and dicing through the light-reflecting layer assembly 5L, the light-transmitting assemblage 43L of the light-transmitting resin assembly 4L with the frame assembly 3L and the substrate assembly 7L at positions c between the frames 3 of the frame assembly 3L to divide into lighting devices 500 with the frames 3 and light-reflecting layers 5.

Since the frame of the lighting device includes a quadrilateral phosphor layer shape that surrounds the light-emitting element, it can be easy to manufacture the light-emitting device with the frame by use of a method of manufacturing a lighting device collectively according to an embodiment of the present invention, for example.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

What is claimed is:

1. A method manufacturing a lighting device comprising:
mounting a light emitting element on a substrate and electrically connecting the light-emitting element to the substrate;
sealing the light emitting element on the substrate by a light-transmitting resin;
dicing the light-transmitting resin vertically and horizontally to form a groove that surrounds the light-transmitting element; and
filling a phosphor-containing resin into the groove to form a frame of the phosphor-containing resin.

2. A method manufacturing a lighting device comprising:
mounting light-emitting elements on a substrate assembly and electrically connecting the light-emitting elements to the substrate assembly;
sealing the light-emitting elements on the substrate assembly by a light-transmitting resin to form a light-transmitting resin assembly;
dicing the light-transmitting resin assembly vertically and horizontally to form grooves that surrounds the light-emitting elements; and
filling a phosphor-containing resin into the grooves to form a frame assembly that comprises frames of the phosphor-containing resin and to form a light-transmitting assemblage.

3. The method manufacturing a lighting device according to claim 2 further comprising:
dicing through the light-transmitting assemblage and the substrate assembly at positions between the frames of the frame assembly to divide into lighting devices with the frames.

4. The method manufacturing a lighting device according to claim 2 comprising:
dicing through the light-transmitting resin assembly and dicing into an upper surface of the substrate assembly to form a cut portion that is cut into the upper surface of the substrate assembly when dicing the light-transmitting resin vertically and horizontally to form grooves.

5. The method manufacturing a lighting device according to claim 2 further comprising:
forming a phosphor layer assembly on an upper surface of the light-transmitting assemblage of the light-transmitting resin assembly with the frame assembly;
dicing through the phosphor layer assembly, the light-transmitting assemblage of the light-transmitting resin assembly with the frame assembly and the substrate assembly at positions between the frames of the frame assembly to divide into lighting devices with the frames.

6. The method manufacturing a lighting device according to claim 2 further comprising:
forming a light-reflecting layer assembly on an upper surface of the light-transmitting assemblage of the light-transmitting resin assembly with the frame assembly;
dicing through the light-reflecting layer assembly, the light-transmitting assemblage of the light-transmitting resin assembly with the frame assembly and the substrate assembly at positions between the frames of the frame assembly to divide into lighting devices with the frames.

* * * * *